United States Patent [19]

Sugita et al.

[11] 4,103,232

[45] Jul. 25, 1978

[54] WAFER TRANSFER DEVICE

[75] Inventors: Kazuhiro Sugita; Chiyohide Kon, both of Yokohama, Japan

[73] Assignee: Sony Corporation, Tokyo, Japan

[21] Appl. No.: 645,020

[22] Filed: Dec. 29, 1975

[30] Foreign Application Priority Data

| Dec. 28, 1974 | [JP] | Japan | 50-3370 |
| Dec. 29, 1974 | [JP] | Japan | 50-2140 |
| Dec. 28, 1974 | [JP] | Japan | 50-3368 |
| Dec. 28, 1974 | [JP] | Japan | 50-3369 |
| Dec. 28, 1974 | [JP] | Japan | 50-3574 |

[51] Int. Cl.$^2$ ............... G01R 31/22; B65G 47/24
[52] U.S. Cl. ............... 324/158 F; 198/394; 214/1 BB; 214/6 F
[58] Field of Search ............... 324/158 F, 51, 73 R, 324/158 P; 29/574; 269/55, 56, 21; 214/6 BA, 6 F, 8.5 C, 1 BB; 271/4; 198/394, 395

[56] References Cited

U.S. PATENT DOCUMENTS

| 3,437,929 | 4/1969 | Glenn | 324/158 F |
| 4,024,963 | 5/1977 | Hautau | 214/6 BA |

OTHER PUBLICATIONS

Welch Catalog; 1968; Sargent–Welch Scientific Co., Skokie, Ill.; p. 640.

*Primary Examiner*—Rudolph V. Rolinec
*Assistant Examiner*—Ernest F. Karlsen
*Attorney, Agent, or Firm*—Lewis H. Eslinger; Alvin Sinderbrand

[57] ABSTRACT

A device to facilitate electrical measurement, including step-and-repeat measurement of minute circuits on a semiconductor wafer by placing the wafer in a specific, angular and cartesian coordinate position with respect to a certain orientation of a disc-like pallet of somewhat larger diameter than the wafer. The apparatus includes a stack of available pallets, each having an indexing portion, arms to engage the pallet in turn and to interfit with the indexing portion, a translational motion device to move the arms and pallet to another specific location to receive the wafer, a controllable section device to hold the wafer and to rotate it about a vertical axis, and a further controlled guide device to move the arms and wafer in specific X and Y directions to a predetermined orientation. The device includes a connection between each pallet and an evacuating apparatus to affix the wafer to the pallet by suction when the wafer is released from the suction device on the orienting structure. The apparatus further includes a receiving structure to receive pallets with wafers affixed thereto. In addition, the pallets and wafers are subsequently moved from a stack of untested wafers to testing apparatus that includes probes arranged to engage specific minute areas on the wafers. One of the probes includes electrical contact means to be energized by engagement with the surface of the wafer and to control additional movement of the probes toward the surface to a specific amount to exert a predetermined pressure by the probes on the wafer. After testing, the pallets with tested wafers are moved to a location set aside therefore.

10 Claims, 22 Drawing Figures

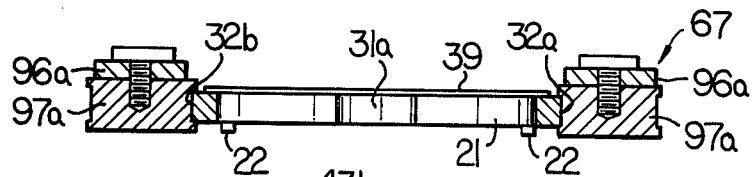
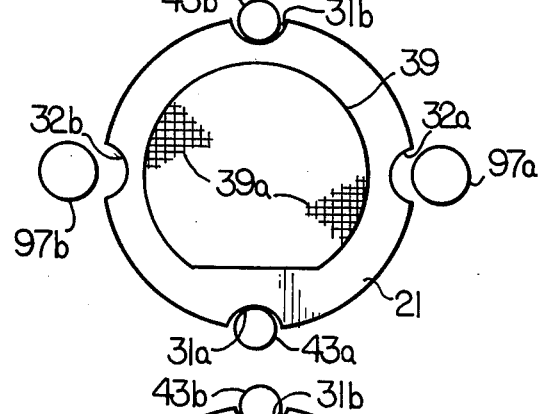
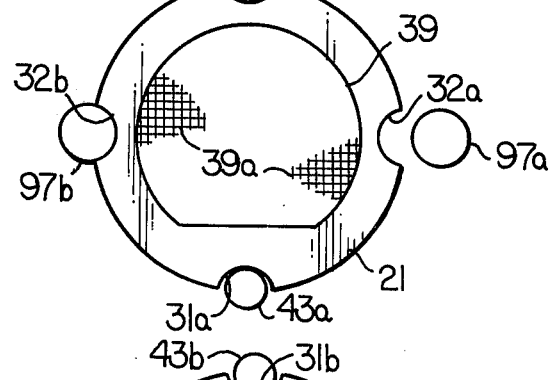
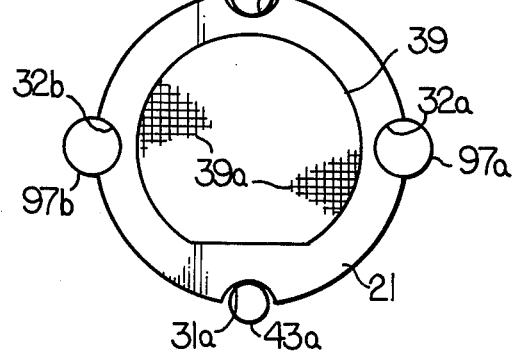

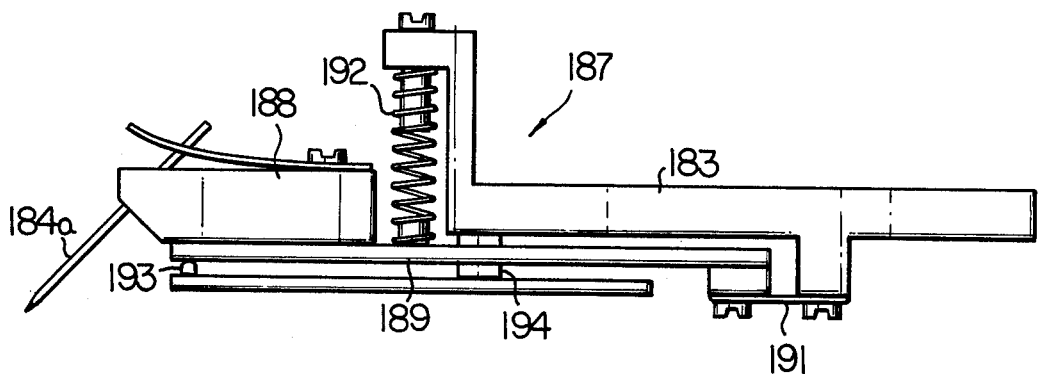
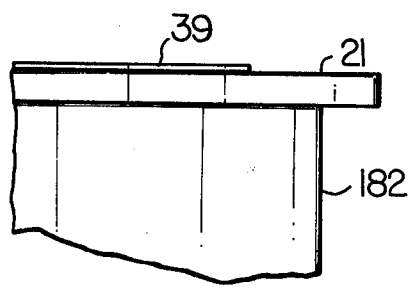
FIG. 19A
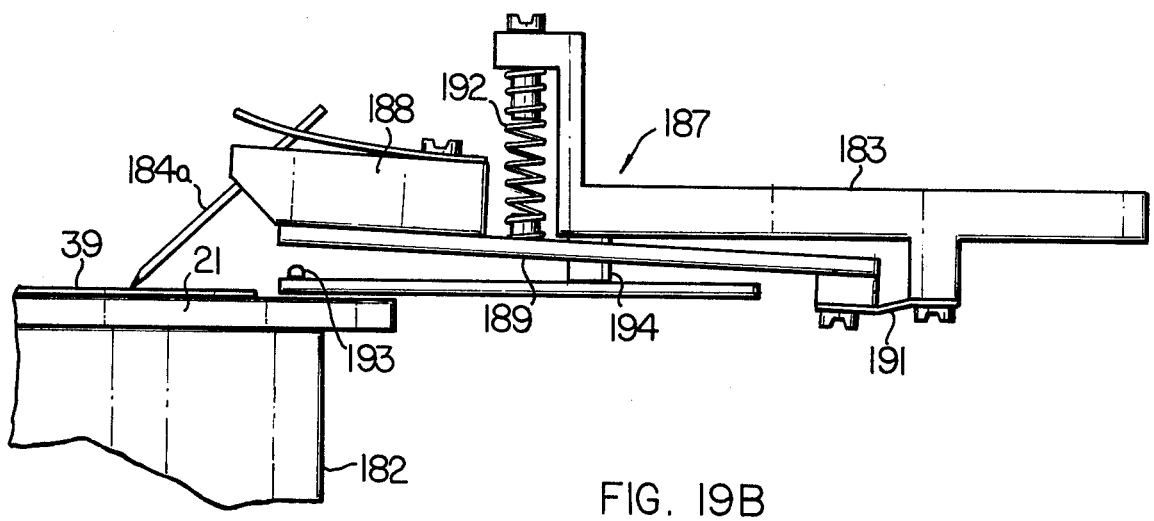
FIG. 19B

WAFER TRANSFER DEVICE

BACKGROUND OF THE INVENTION

1. Field of the Invention

This invention relates to apparatus for handling semiconductor wafers to facilitate making electrical tests on semiconductor devices formed in a matrix arrangement consisting of a large number of identical devices, each of which has up to 20 contact areas of microscopic size, on the surface of a semiconductor wafer.

2. The Prior Art

Semiconductor devices are formed on the surface of a semiconductor wafer approximately 7 or 8 centimeters in diameter divided into a matrix of individual units having length and width dimensions of approximately 1 to 4 millimeters. All of the devices formed on a single semiconductor wafer are identical with each other and each of them has a number of contact pads to which lead wires will eventually be connected in further manufacturing steps after the wafer has been divided into the individual semiconductor chips, each of which corresponds to one cell of the matrix. Before the wires are connected, it is desirable to test each chip to determine that its electrical characteristics are correct according to its design, and such testing is preferably carried out before the relatively large semiconductor wafer is broken up into the individual chips.

Testing apparatus may be in the form of a machine that has means for holding the wafer and for moving it precise distances corresponding to the dimensions of each of the chips thereon. At each position up to 20 contacts must be brought into engagement with the contact pad areas of each chip. These pad areas have dimensions on the order of 100 microns × 100 microns, and they may be spaced apart by a generally similar order of magnitude. Thus the precision of placement of the contacts on the contact pads is of a high order of exactness.

Not only is it necessary that the contacts be accurately placed on the pads of a given chip area, but the direction and distance of movement to bring those contacts into proper relation with additional chips in the matrix requires very accurate angular alignment between the matrix grid directions and the directions of movement of the testing apparatus. This is necessary to prevent the testing contacts, which might be making acceptable connections with the first chip at one corner of the matrix, from drifting away from the proper contact pad areas as the apparatus moved along the matrix rows and columns.

SUMMARY OF THE INVENTION

In accordance with the present invention semiconductor wafers on which the necessary pattern of conductive, semiconductive, and insulating areas have been placed is placed on a relatively rigid pallet having dimensions a little larger than the wafer. The pallet is connected to evacuating means and has holes in its surface so that when a wafer is placed on that surface, the evacuating means can evacuate the channels in the pallet, causing the wafer to be firmly attached to the pallet by ambient air pressure. While the wafer is being precisely located on the surface of the pallet, and before the pallet is evacuated, the pallet and wafer are firmly held by apparatus that permits translatory and rotational movement between the pallet and the wafer. A microscope incorporated in the apparatus makes it possible for the operator to determine when the relative position of the pallet and wafer is exactly correct. Thereafter, the pallet is evacuated with the wafer in surface-to-surface contact with it, and the pallet with the attached wafer is ready for testing. The pallet has orienting surfaces on it so that it can always by brought into a precise position in apparatus with matching surfaces to assure that the relative position between the wafer and the pallet will be meaningful.

BRIEF DESCRIPTION OF THE DRAWINGS

FIG. 9 shows a part of the pallet and wafer and support structure of FIG. 8.

FIGS. 10A-10C show means for indexing the angular position of a pallet.

FIGS. 19A and 19B show means for controlling the probe pressure in the testing apparatus of FIGS. 16 and 17.

DESCRIPTION OF THE PREFERRED EMBODIMENTS

Figure 1:
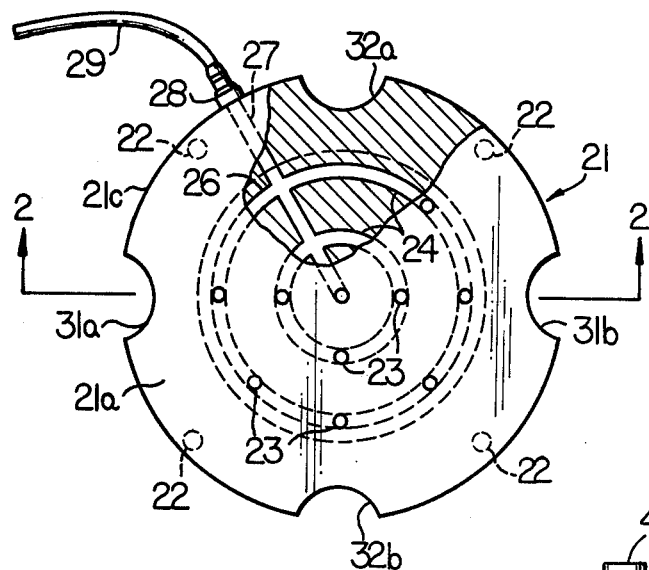
FIG. 1 is a plan view of a pallet with part of the structure broken away to show the interior features.
Figure 2:
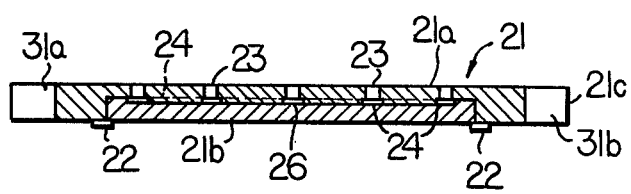
FIG. 2 is a cross-sectional view of the pallet of FIG. 1.

FIGS. 1 and 2 show a pallet that incorporates features of the present invention. This pallet 21 has an upper major surface 21a, a lower major surface 21b, and a perimeter 21c. Extending downwardly from the lower surface 21b are four pins 22 of equal height. The height of these pins is greater than the thickness of a semiconductor wafer and the distance between diametrically opposite pairs of the pins is greater than the diameter of a wafer. This permits similar pallets to be stacked one upon the other with the pins 22 of each pallet resting on the surface 21a of the pallet below it but without effecting a wafer resting on the surface 21a of the lower pallet.

The pallet 21 has a plurality of inlets 23 extending through its upper surface 21a. These inlets are arranged to connect with concentric conduits 24 joined together by a radial contact 26 that extends to the perimeter 21c and terminates in an outlet 27. A pipe joint 28 is connected to the outlet 27 and tubing 29 is connected to the joint 28. This tubing may be made of vinyl so as to be flexible and yet be sufficiently impervious to permit the conduits 24 and 26 within the pallet 21 to be sufficiently evacuated so that air pressure on the wafer resting on the upper surface 21a will hold the wafer firmly in place.

Two diametrically opposite pairs of recesses 31a, 31b and 32a, 32b are equally spaced around the perimeter 21c of the pallet, the surfaces of these recesses form locating surfaces to be used by pallet moving apparatus, and by apparatus used when a wafer is placed on the pallet and when the wafer is tested.

Figure 3:
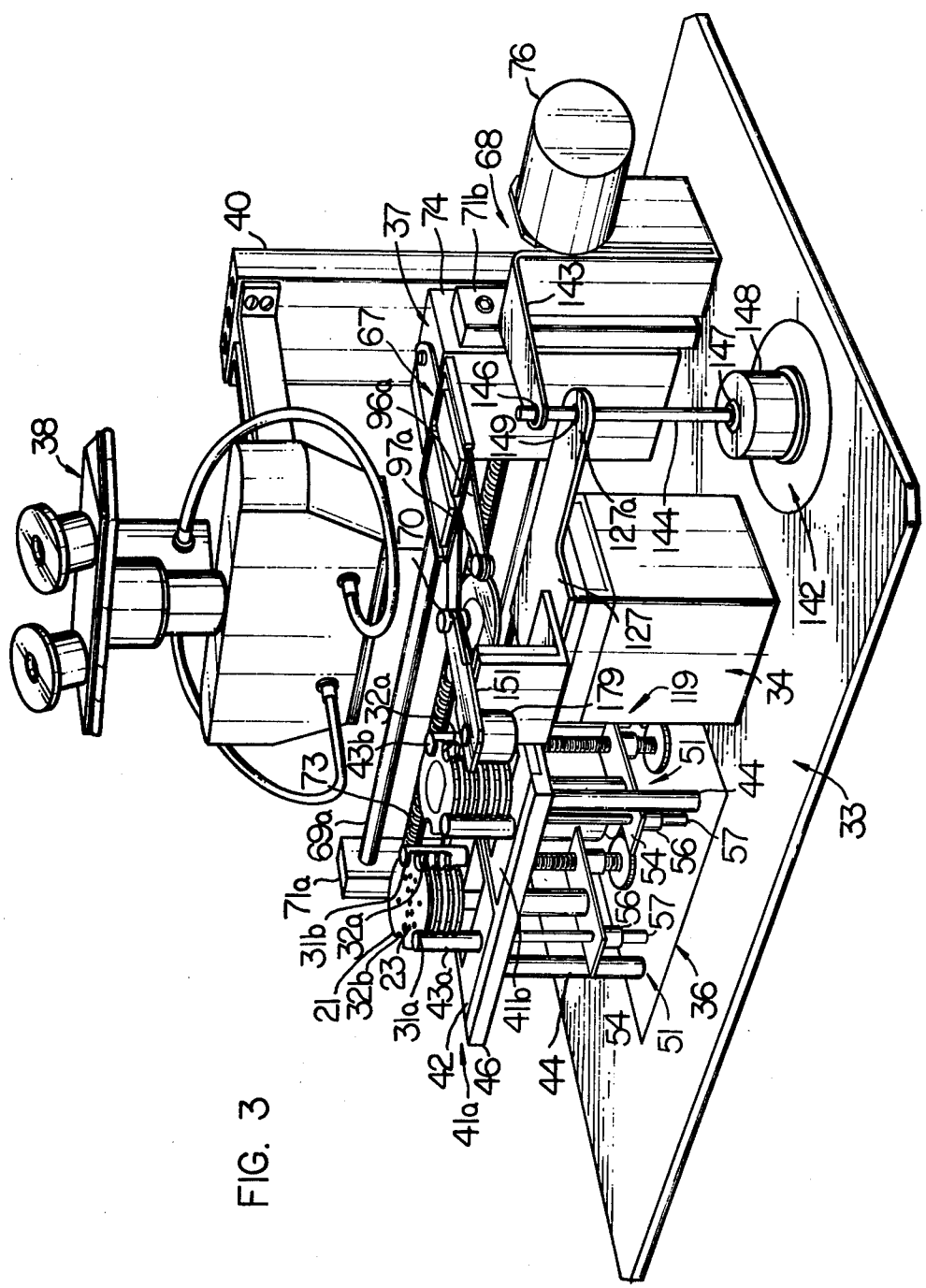
FIG. 3 is a perspective view of apparatus for positioning wafers on pallets.
Figure 4:
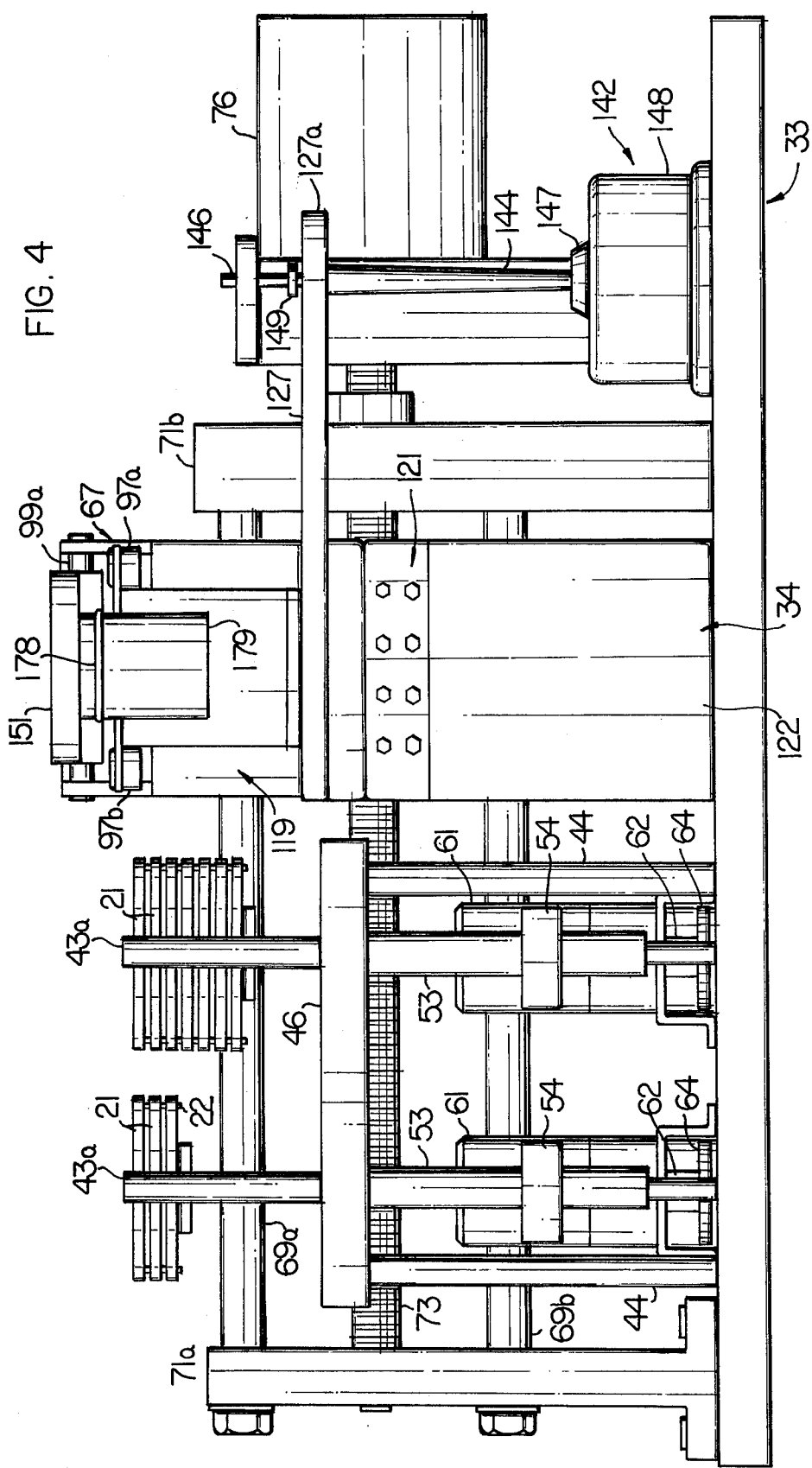
FIG. 4 is a front-elevational view of the apparatus in FIG. 3.
Figure 5:
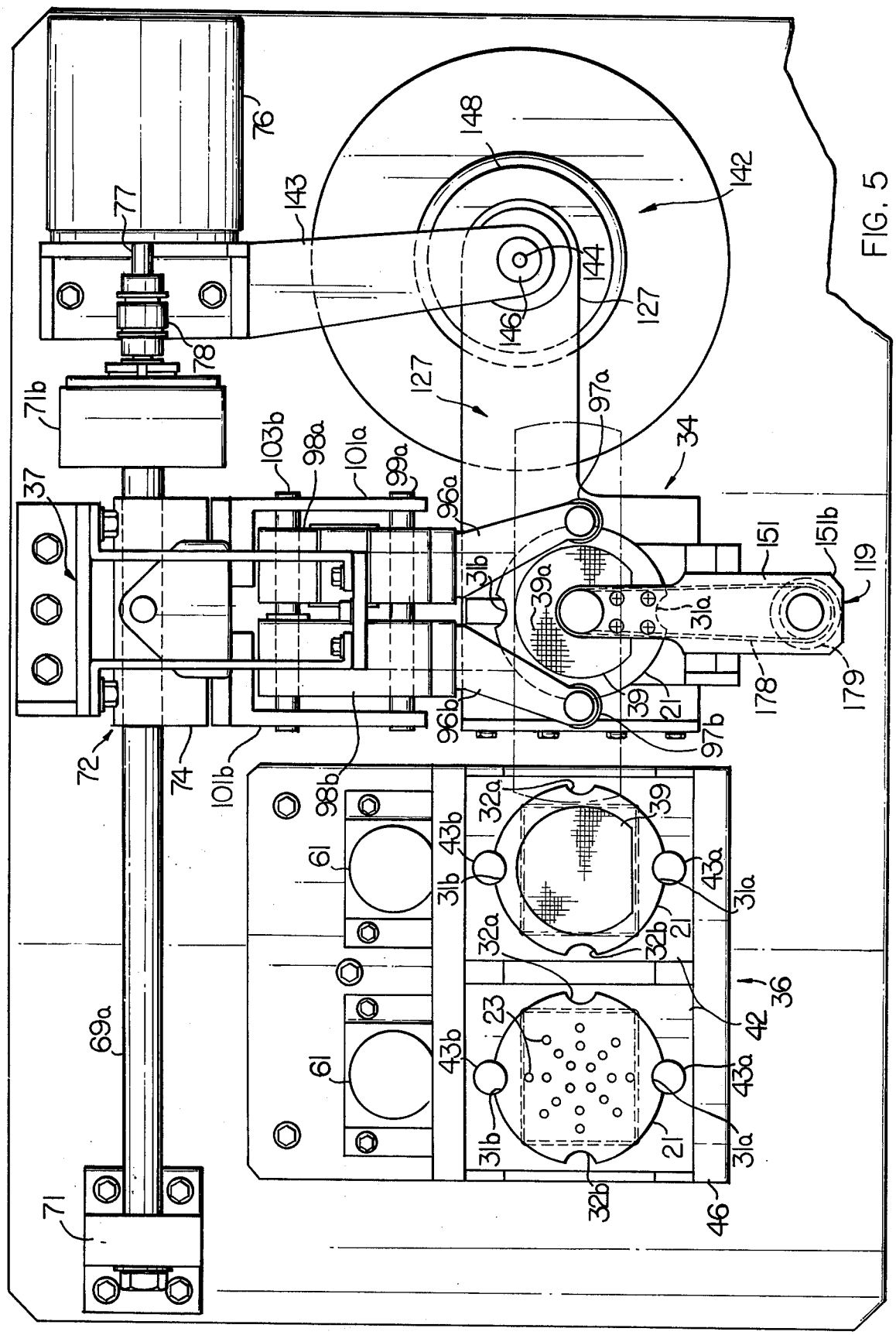
FIG. 5 is a plan view of the apparatus in FIGS. 3 and 4.

FIGS. 3-5 show apparatus for mounting a wafer on a pallet. This apparatus includes a base 33 with wafer aligning apparatus 34 and pallet storing apparatus 36 mounted on it. Pallet carrying apparatus 37 moves pallets between the storing apparatus 36 and the aligning apparatus 34, and vice versa. A microscope 38 is placed in position to permit the surface of a wafer 39 to be viewed when that wafer is being mounted on a pallet 21. The wafers 39 have been processed to the extent that they have a matrix arrangement of elemental structures, called chips, each of which has on its surface minute contact pads and a pattern of semiconductive, conductive, and insulating material according to the design of the semiconductor device. Typically, a wafer 39 having a diameter of about 7 or 8 centimeters may comprise hundreds of such chips, which will eventually be broken apart from one another and used in individual semiconductor devices.

The apparatus is shown with two stacks of pallets 21, the left hand stack consisting of pallets on which no wafer has been mounted, and the right hand stack consisting of pallets whith wafers 39 mounted on them. In the left hand stack, the inlet holes 23 appear, but these holes are covered up by the wafer 39 in the right hand stack. All of the pallets include diametrically opposed recesses 31a and 31b and other recesses 32a and 32b. There are two pallet support members 41a and 41b mounted on a base plate 42. Each of the pallet support members has a pair of parallel vertical rods 43a and 43b rigidly attached to it. These rods cooperate with the recesses 31a and 31b to hold the pallets 21 precisely positioned, both before and after the wafers 39 are mounted thereon.

The pallet storing apparatus 36 also includes four posts 44, only two of which appear in the drawings. At the upper end of these posts is a plate 46 which is rigidly supported by the posts.

Figure 6:
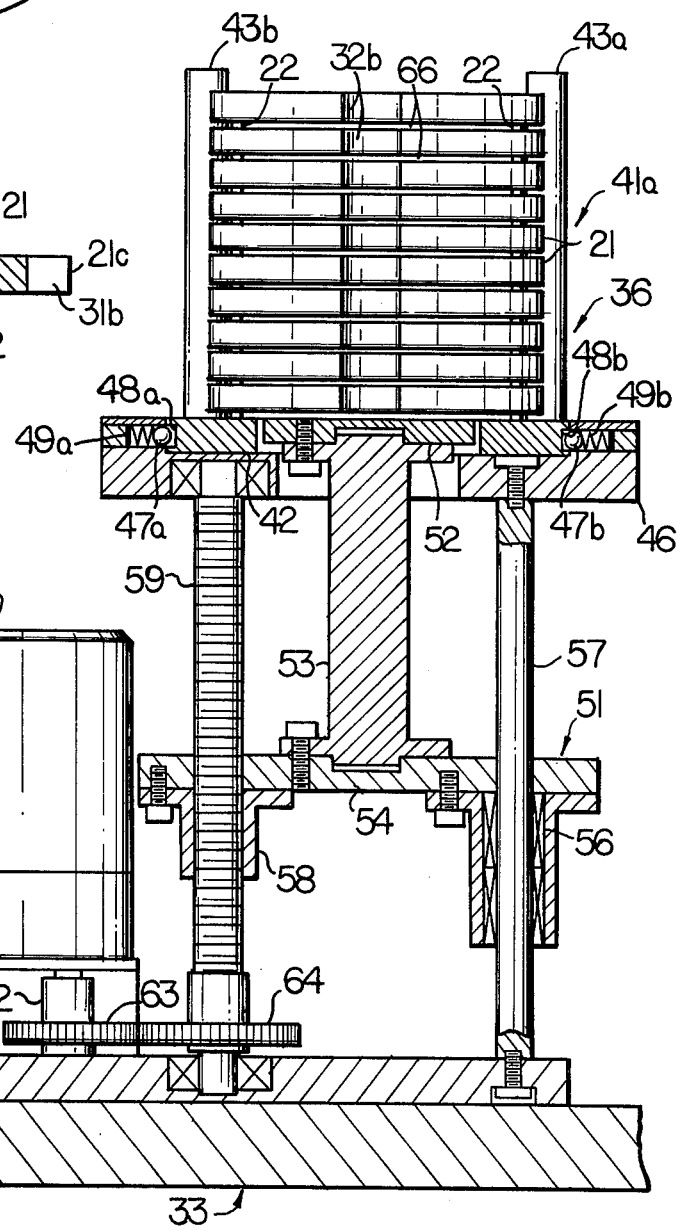
FIG. 6 is a cross-sectional view of part of the apparatus in FIGS. 3-5.

The base plates 42 are slidably movable in the plate 46 to positions controlled by by steel balls 47a and 47b cooperating with grooves 48a and 48b in opposite edges of the plates 42, as shown in FIG. 6. Captive springs 49a and 49b exert pressure on the balls 47a and 47b to force them against opposite sides of the plates 42.

The pallet storing apparatus 36 also includes two elevator devices 51, which are best shown in FIG. 6. Each elevator device includes a pallet support plate 52 at the upper end of a pedestal 53, the lower end of which is attached to a plate 54 that is guided by a bearing 56 to move up and down on a smooth rod 57. Vertical motion is imparted to the plate 54 by a nut 58 attached to the plate 54 and threaded onto a lead screw 59. A synchronous motor 61 with an output shaft 62 is connected to the lead screw 59 by a set of gears 63 and 64 to turn the lead screw 59 when it is desired to move the palate support plate 52 up or down. As may be seen in FIG. 6, the pins 22 hold adjacent pallets 21 far enough apart to leave spaces 66 therebetween of greater height than the thickness of a wafer 39.

The pallet carrying apparatus 37 that carries a pallet from the stack on the pallet support member 41a to the wafer aligning apparatus 34 and, after a wafer 39 has been mounted on it, to the stack of pallets on the pallet support member 41b includes pallet securing apparatus 67 and driving apparatus 68 for effecting horizontal movement of the apparatus 67. The apparatus 67 is supported on two parallel guide rods 69a and 69b, which, in turn, are supported by two posts 71a and 71b. The apparatus 37 further includes a section 72 for effecting vertical movement of the pallet securing apparatus 67. Between the guide rods 69a and 69b is a lead screw 73 on which is mounted a moving block 74. The lead screw is driven by a motor 76, the shaft 77 of which is connected by a coupling 78 to the lead screw.

Figure 7:
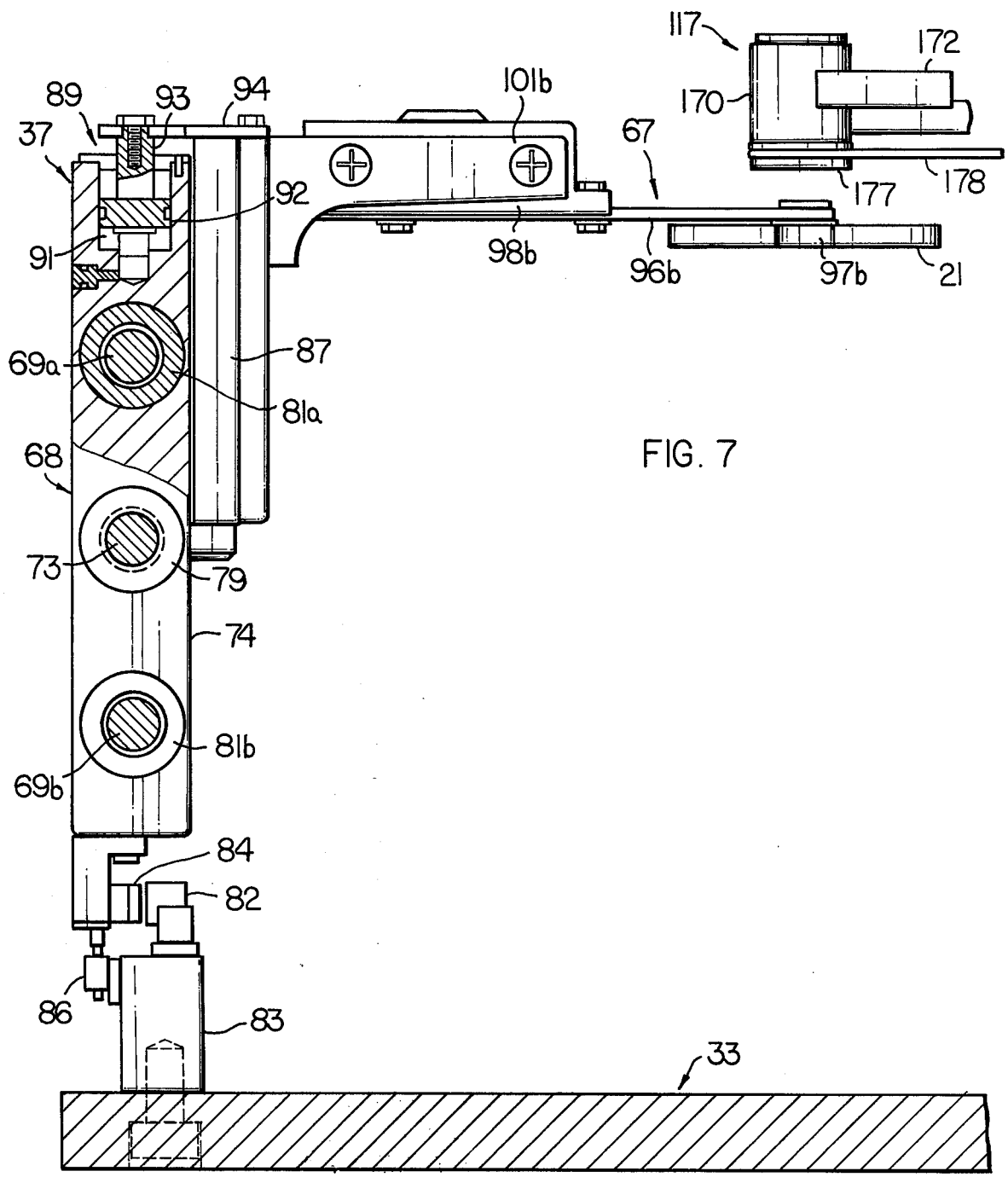
FIG. 7 is a side view of pallet carrying apparatus with parts of the apparatus broken away to show interior features.

FIG. 7 shows a side view of the moving block 74 mounted on the guide rods 69a and 69b and driven by the lead screw 73. The driving connection between the lead screw 73 and the block 74 is a nut 79 attached to the block 74 and threaded onto the screw 73. A pair of bearings 81a and 81b guide the block 74 along the guide rods 69a and 69b.

Three magnetic sensors 82 are mounted on a support 83. These sensors detect magnets 84 attached to the block 74. These sensors are located at positions that correspond to the location of the pallet securing apparatus 67 at the pallet support member 41a, the pallet support member 41b, and the wafer aligning apparatus 34. Three microswitches 86 may be located at positions corresponding to the positions of the magnetic sensors 82.

Figure 8:
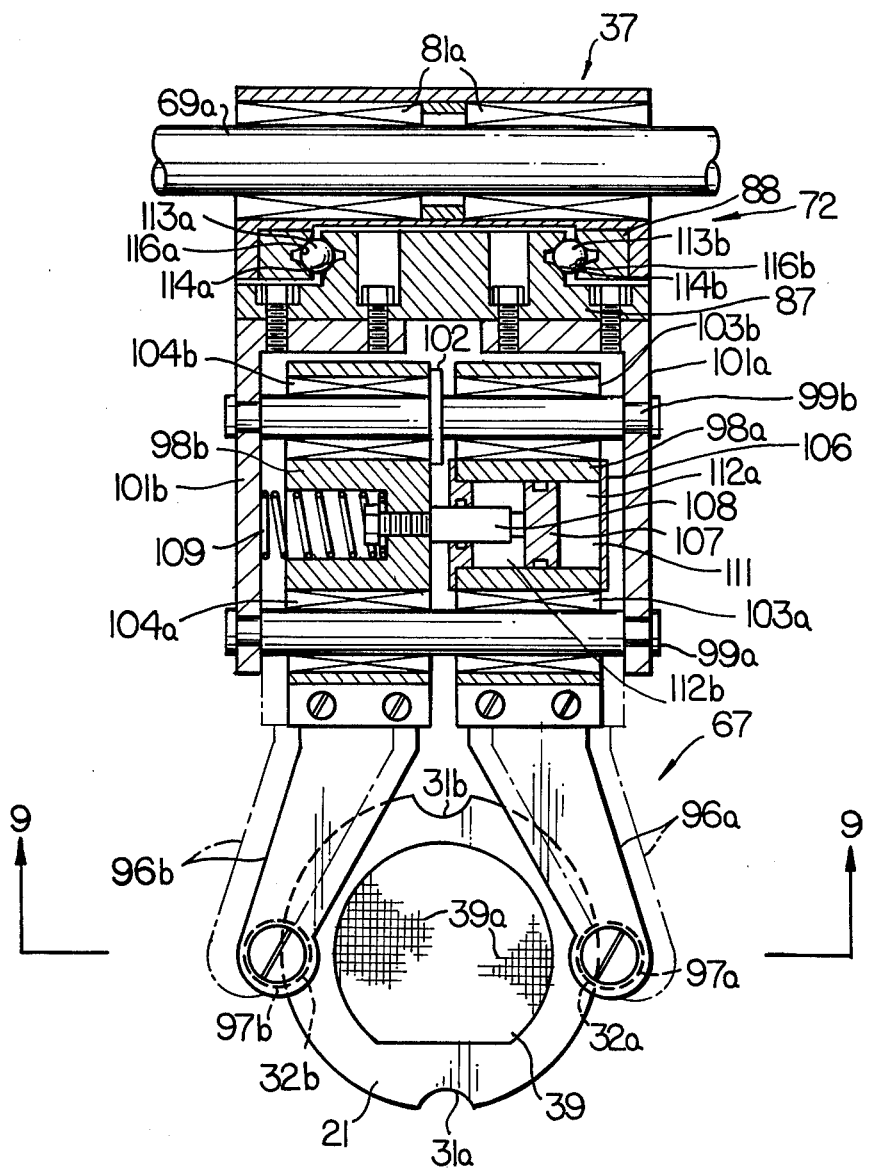
FIG. 8 is a cross-sectional view of pallet holding apparatus.

FIG. 8 shows the pallet securing apparatus 67 in greater detail. This apparatus includes a block 87 capable of vertical movement in a guide 88 under the control of an air cylinder 89 shown in FIG. 7. This air cylinder includes a chamber 91, a piston 92, and a piston rod 93. The latter is attached by means of a plate 94 to the block 87 to move the block 87 up and down as air is forced into or allowed to drain from the enclosed lower part of the cylinder 91.

The pallet securing apparatus 67 has a pair of movable arms 96a and 96b. At the ends of these arms are two rollers 97a and 97b, respectively. These rollers are shaped to fit into the recesses 32a and 32b in the pallets 21. The arms 96a and 96b are attached, respectively, to a pair of moving blocks 98a and 98b slidably mounted on a pair of guides 99a and 99b held between a pair of supports 101a and 101b. The guide 99b has a flange 102 on it to limit the movement of the blocks 98a and 98b on the guides 99a and 99b. The arm 96a is positioned on the guides 98a and 99a by a pair of guide sleeves 103a and 103b. The block 98b is similarly supported by a pair of guide sleeves 104a and 104b on the guides 99a and 99b, respectively.

Sliding movement of the blocks 98a and 98b along the guides 99a ad 99b is controlled by air applied to a cylinder 106 that has a piston 107 slidably mounted in it. The cylinder 106 is part of the block 98a and the piston 107 is connected by a piston rod 108 to the block 98b. A compression spring 109 urges the block 98b to the right as shown in FIG. 8 and against the flange 102. The cylinder 106 has a chamber 111 divided into two parts 112a and 112b by the piston 107. Air supply means (not shown) are connected to the chamber sections 112a and 112b to control the positions of both of the blocks 98a and 98b.

FIGS. 9 and 10A–10C illustrate the operation of the pallet securing apparatus 67. FIG. 9 shows, particularly, side views of the rollers 97a and 97b, which have small flanges at each end to facilitate grasping opposite edges of the pallet 21 in the recesses 32a and 32b without dropping the pallet or having to apply excess pressure to the pallet. The rollers 97a and 97b are only slightly longer than the thickness of the pallet, or at least, do not extend substantially below the lower level of the pins 22 and therefore do not engage any pallet that might be underneath the top pallet 21 on a stack.

FIGS. 10A–10C show a pallet 39 stacked up on the posts 43a and 43b. These posts fit into the recesses 31a and 31b and have radii that are slightly smaller than the radii of the recesses 31a and 31b, because it is not necessary to keep the pallets in very accurate alignment on these posts. The radii of the rollers 97a and 97b, on the other hand, closely match the radii of the recesses 32a and 32b so that, when the rollers 97a and 97b grip the pallet 21 to move it, the exact alignment with the grid defining the individual chips 39a or the semiconductor wafer 39 will be retained.

Initially, when the pallet carrying apparatus 37 of FIG. 8 is in position to pick up a pallet 21, as shown in FIG. 8 and FIGS. 10A–10C, air is forced into the chamber section 112a to push the piston 107 leftward as far as it will go, thereby moving the block 98b to the left and compressing the spring 109. At the same time, the block 98a will be forced to the right so that the rollers 97a and 97b will occupy the positions shown in FIG. 10A relative to the pallet 21. Thereafter, air is released from the chamber section 112a and forced into the chamber section 112b. This allows the spring 109 to force the block 98b to the right so as to bring the roller 97b into engagement with the recess 32b in the pallet 21, as shown in FIG. 10B. Continued increase of air pressure in the chamber section 112b and removal of air pressure from the chamber section 112a causes the block 98a to move to the left so as to bring the roller 97a into engagement with the recesses 32a in the pallet 21, as shown in FIG. 10C. The block 87 can then be moved vertically, guided by steel balls 113a and 113b within juxtaposed V-shaped grooves 114a, 116a, and 114b, 116b (FIG. 8), respectively. As shown in FIG. 7, vertical movement of the block 87 is controlled by air admitted to the chamber 91 in FIG. 7. The pallet carrying apparatus 37 can then be moved left or right along the guide rods 69a and 69b to carry the pallet 21 to the next desired position.

After the pallet 21 has been moved to the new position and lowered to the proper level, it can be released by admitting air to the chamber section 112a and releasing it from section 112b. The spring 109 can then force the blocks 98a and 98b apart.

Figure 11:
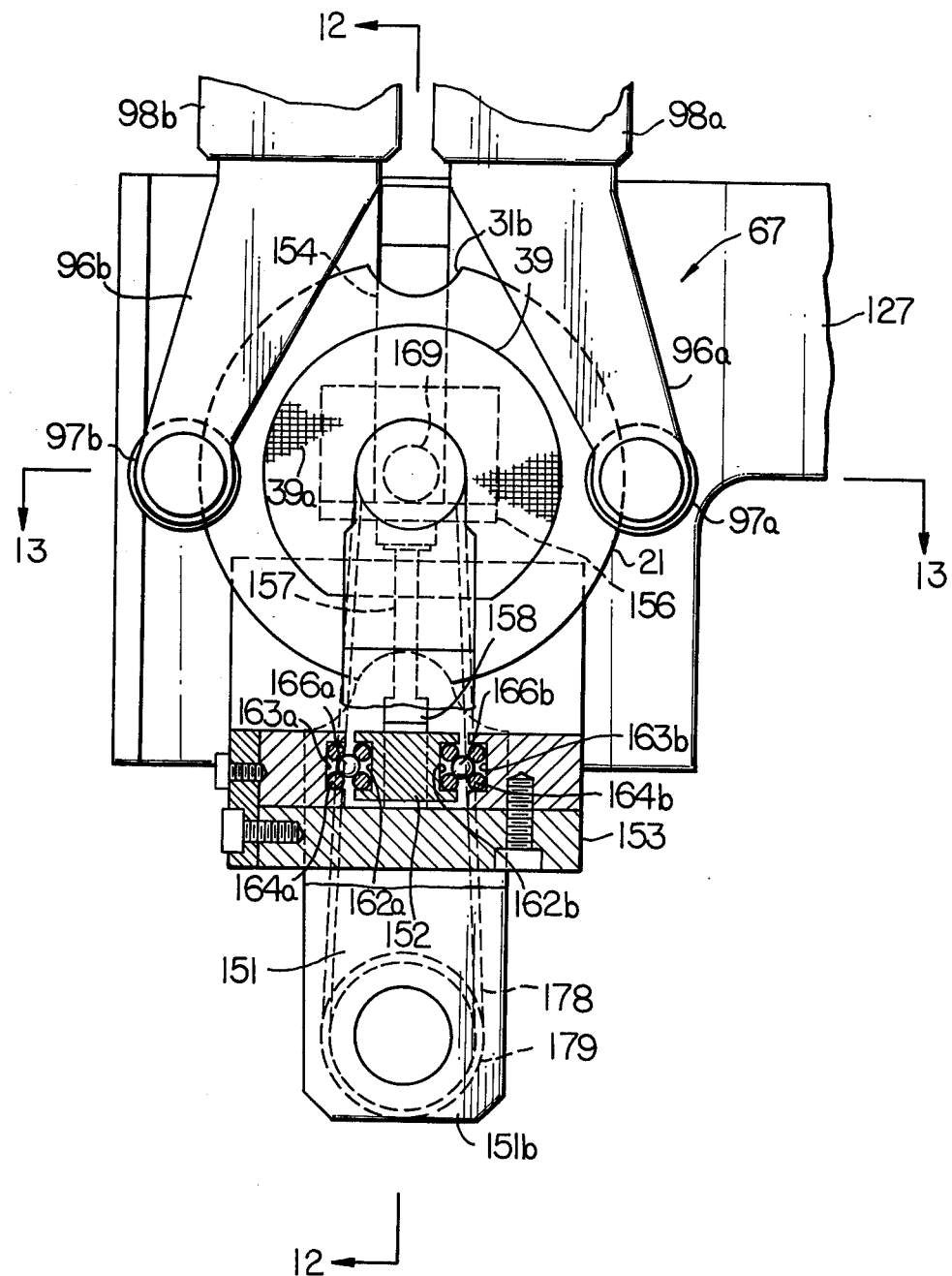
FIG. 11 shows part of the apparatus for holding a wafer relative to a pallet in positioning the wafer and the palate properly.
Figure 12:
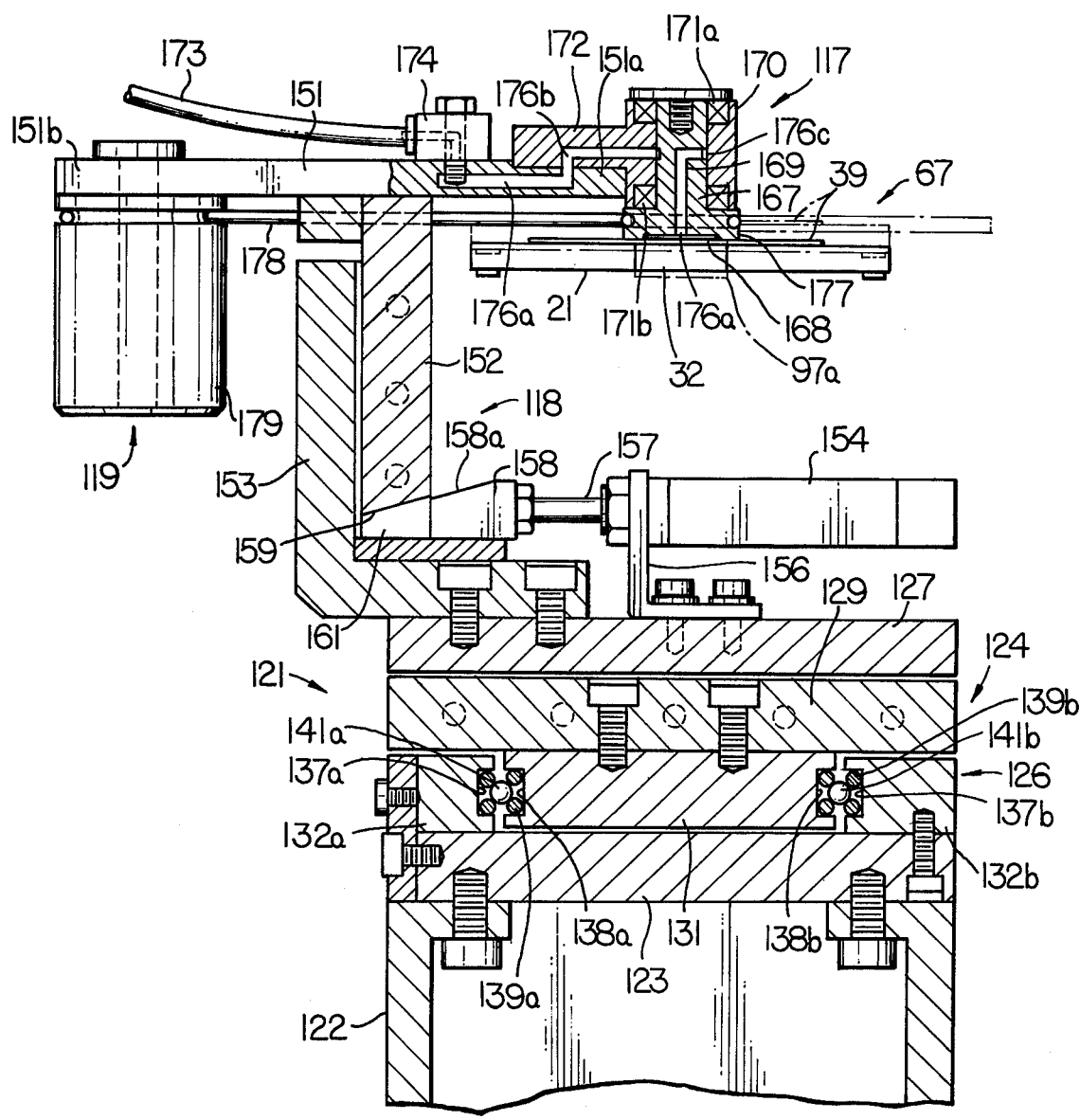
FIG. 12 is a cross-sectional, side view of the apparatus in FIG. 11.
Figure 13:
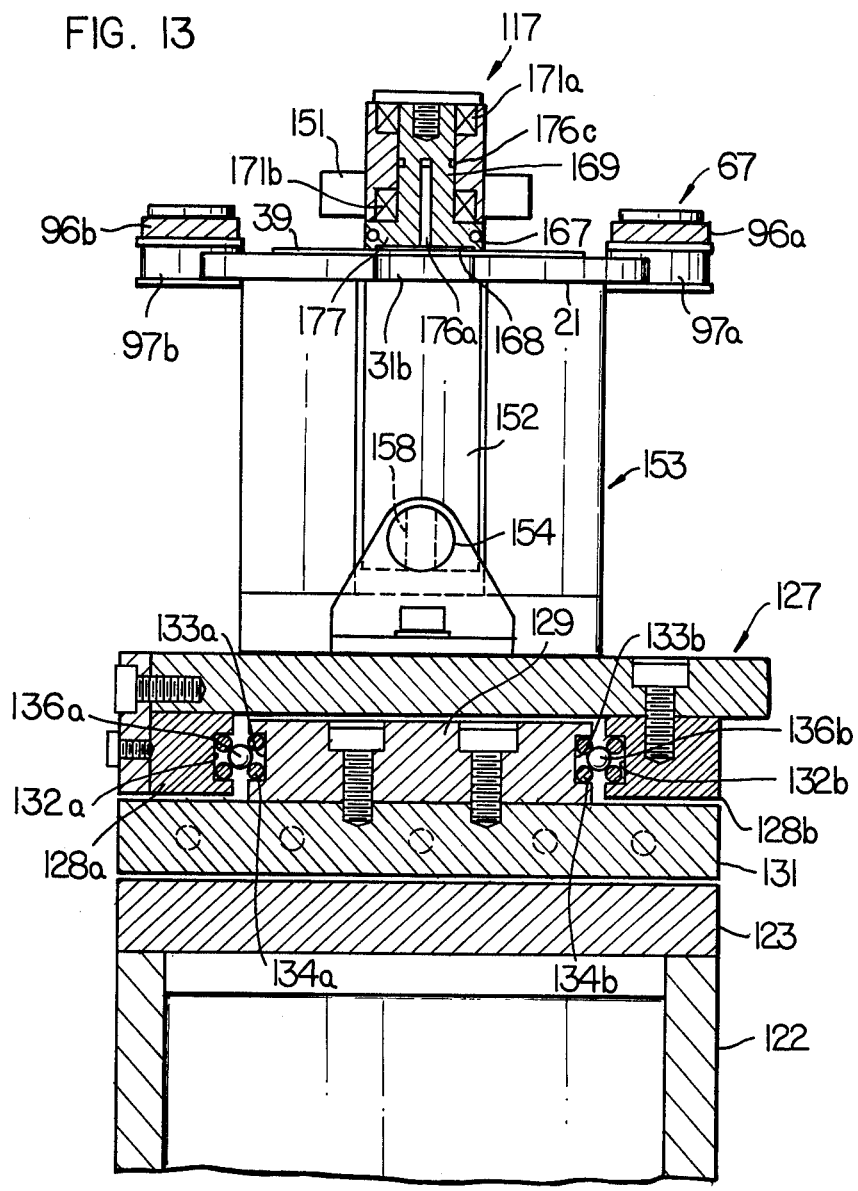
FIG. 13 is a cross-sectional, front view of the apparatus in FIG. 11.

FIGS. 11–13 show in detail apparatus for aligning a wafer 39 on a pallet 21. For this purpose, the pallet carrying apparatus 37 must be in the position shown in FIG. 3. In FIGS. 11 and 13 the rollers 97a and 97b are shown grasping the edges of the pallet 21. Apparatus 117 is provided for securing a wafer 39 by a suction device. Apparatus 118 is provided for raising and lowering the apparatus 117, and apparatus 119 provides means for rotating the wafer 39. Reference numeral 121 indicates, generally, apparatus for moving the entire structure comprising apparatus 117–119 horizontally to effect translatory movement in one direction. The apparatus 121 has a support structure 112 with a top plate 123. Two movable blocks 124 and 126 are supported by the top plate 123 for horizontal movement in mutually perpendicular directions, i.e. in the X and Y coordinate directions. The apparatus 117–119 is supported on an upper plate 127 that has a pair of guides 128a and 128b attached to its lower surface. These guides embrace a plate 129 affixed to the upper surface of a sliding plate 131. This plate, in turn, extends between another pair of guides 132a and 132b attached to the upper surface of the plate 123.

The guides 128a and 128b have grooves 132a and 132b, respectively, facing corresponding grooves 133a and 133b in the plate 129. Steel lines 134a are inserted into the grooves 132a and 133a to serve as guides for steel balls 136a. Similar steel lines 134b are inserted into the grooves 132b and 133b to guide steel balls 136b. Similar guide grooves 137a and 137b are formed in surfaces of the guides 132a and 132b facing corresponding grooves 138a and 138b in opposite edges of the plate 131. The grooves 137a and 138a are provided with steel lines 139a to guide steel balls 141a, and the grooves 137b and 138b are similarly provided with steel lines 139b to guide steel balls 141b.

Figure 14:
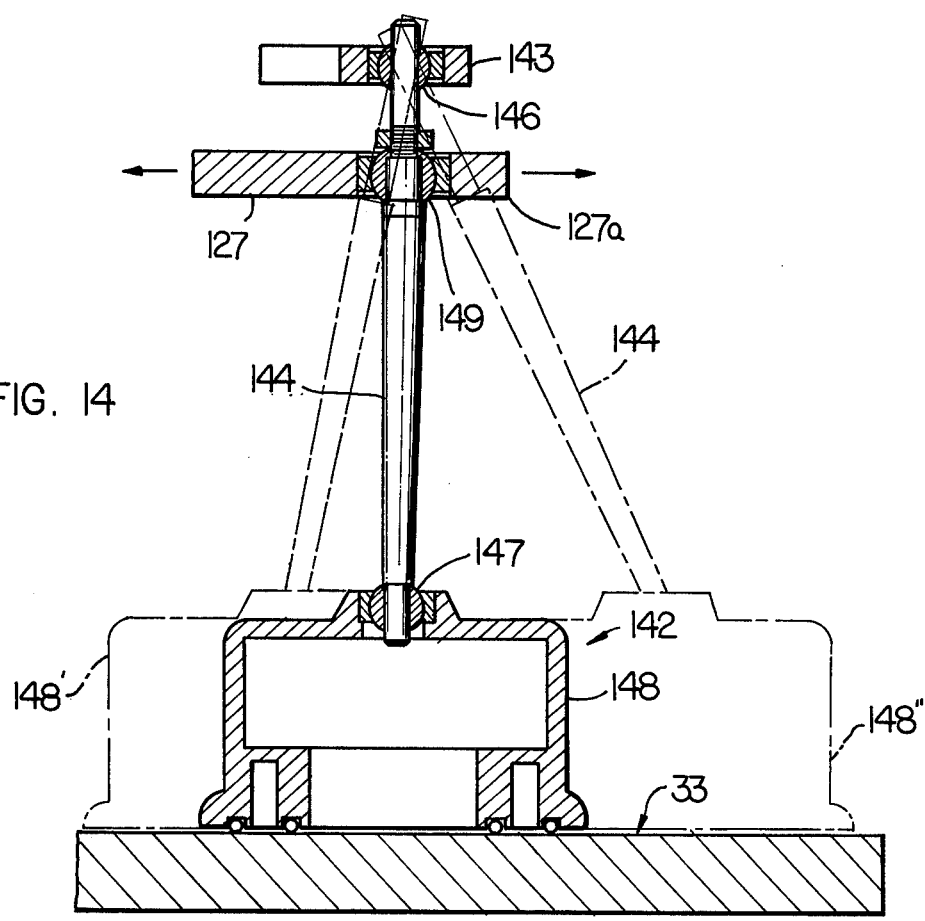
FIG. 14 shows apparatus for obtaining precise control of relative movement between the pallet and the wafer.
Figure 15:
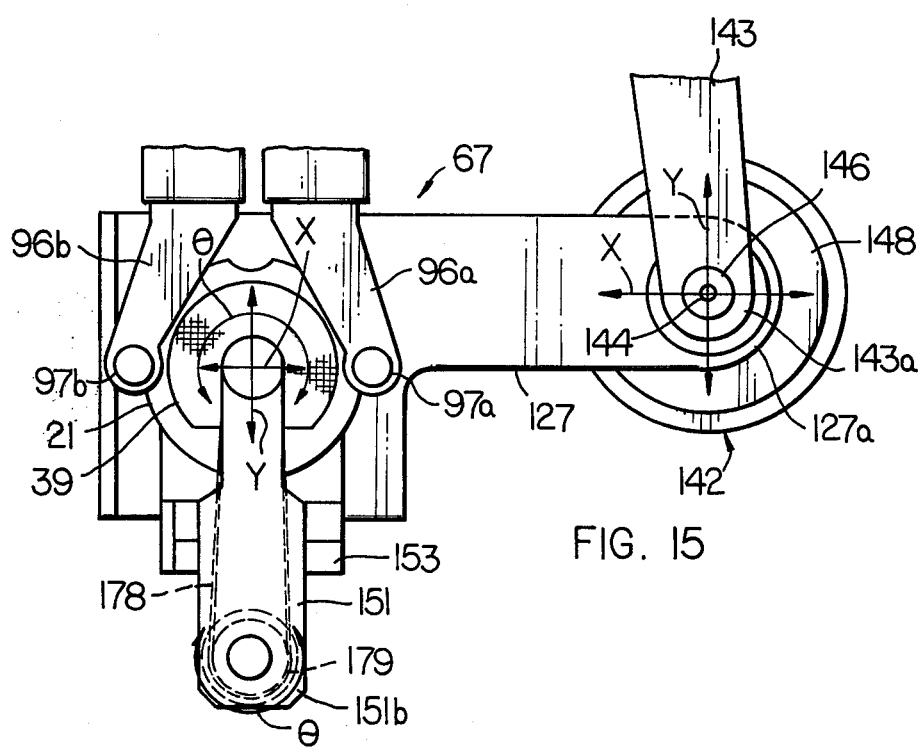
FIG. 15 is a plan view of part of the apparatus for controlling the movement of the wafer and pallet.

While the structure just described permits orthogonal translatory movement and rotation of a wafer 39, the apparatus to control that movement is shown in FIGS. 3–5, and in more detail, in FIGS. 14 and 15. The control apparatus is generally identified by reference numeral 142. This apparatus includes a support plate 143 which, as shown in FIG. 3, is in the form of an arm of a bracket attached to the base 33. A rod 144 extends through a ball joint 146 in the plate 143. The lower end of the rod 144 is attached to another ball joint 147 secured to a drum 148. This drum is slidably movable on the surface of the base 33 in any direction within a circular area. FIG. 14 shows, in broken lines, two alternative positions 148' and 148" for the drum 148.

A third ball joint 149 on the rod 144 is held within a hole near the end 127a of the support 127.

As is indicated in FIG. 15, any sliding movement of the drum 148 is equivalent to moving the support 127 to a position that corresponds to a certain X and Y coordinate intersection. This movement of the drum 148 can be carried out by hand by the operator, and the construction of the drum and the surface of the base 33 is such that minute movements can easily be transmitted to the support 127. Furthermore, the lever action of the rod 144, which is effectively pivoted in the ball joint 146, is such that a relatively large movement of the drum 148 is reduced to a small movement of the support 127. Because of the ball joints 147 and 149, no rotational movement of the drum 148 is transmitted to the support 127. As a result, although the drum 148 is coupled to the support 127 with very little lost motion, the operator is effectively prevented from moving the rod 144 and thus the support 127 vertically and from rotating the rod 144 or the support 127. Only pure translational movement is transmitted from the drum 148 to the support 127.

FIGS. 11–13 and 15 show a support plate 151 that supports the apparatus 117. The plate 151 is, itself, supported on the upper end of a block 152 capable of sliding up and down on a guide 153. Movement of the block 152 is effected by an air cylinder 154 attached to a bracket 156 mounted on the plate 127. The air cylinder 154 has a piston rod 157 movable left and right relative to the position shown in FIG. 12. A sliding block 158 on the end of the rod 157 has a sloping upper face 158a that engages a correspondingly sloping lower face 159 of the block 152. The farther the block 158 is moved to the left into the region 161, the higher the block 152 and apparatus supported on it will be raised.

FIG. 11 shows that the block 152 has grooves 162a and 162b along its vertical edges. These grooves face corresponding grooves 163a and 163b on the guide 153. The slots 162a and 163a have steel lines 164a held in them to guide steel balls 166a. Correspondingly, the grooves 162b and 163b have steel lines 164b in them to guide steel balls 166b.

The apparatus 117 for rotating a wafer 39 includes a suction member 167 with a recessed face 168 and an axle 169 of reduced diameter. The axle is held in a sleeve 170 and is made freely rotatable therein by a pair of bearing 171a and 171b. The sleeve 170 is located at the end of a support arm 172 attached to the end of the plate 151.

A vacuum line 173 is connected by means of a pipe joint 174 to a series of channel sections including a section 176a within the plate 151, a section 176b within the arm 172, an annular groove 176c in the reduced diameter section 169 at the level of the section 176b, and a section 176d that extends from the annular groove 176c to the recessed face 168 of the suction member 167.

The suction member 167 has an annular groove near its lower end so that it forms a pulley 177 connected by a belt 178 to a knob 179 rotatably mounted in the plate 151 at the end 151b.

Rotation of the knob 179 by the operator is transmitted by the belt 178 to the suction member 167 and thus to a wafer 39, if there is a wafer affixed by suction to the suction member. As shown in FIG. 15, rotation of the knob 179 and movement of the drum 148 are all that is necessary to effect rotation of the wafer 39 through any desired angle and orthogonal movement along X and Y axes defined by the sliding guides in the apparatus 121 (FIG. 12).

Operation of the apparatus described so far in FIGS. 3-15 begins with the selection of the top pallet 21 from the pallet support member 41a. The elevator device 51 keeps the top pallet 21 always at a certain level, and as pallets are removed, the elevator device lifts the remaining pallets so that the top one will again be at that level.

The top pallet is grasped by moving the blocks 98a and 98b to cause the rollers 97a and 97b to engage the recesses 32a and 32b on the pallet 21. The block 87 is then elevated sufficiently to clear the posts 43a and 43b on both of the pallet support members 41a and 41b. Actuation of the motor 76 then causes the lead screw 73 to rotate so as to move the pallet carrying apparatus 37 to the location of the pallet aligning apparatus 34.

The operator then places a wafer 39 on the surface of the pallet 21 and actuates the air cylinder 154 to cause the apparatus 117 to descend so that the suction device 167 is against the upper surface of the wafer. Suction is then applied by way of the line 173 to hold the wafer on the end of the suction device 167 while the latter is elevated by reversing the operation of the air cylinder 54 to cause the wafer 39 to be lifted up above the surface of the pallet 21.

The wafer 39 has previously had its individual chip areas 39a produced, thereby producing lines in the X and Y directions. The microscope 38 mounted on the support 40 is focused on the lines on the surface of the wafer 39, and the operator then moves the drum 148 and the knob 179 to effect movement of the wafer 39 to align the X and Y lines on the surface of the wafer 39 with reticles in the microscope.

The air cylinder 154 is then actuated to lower the wafer 39 onto the surface of the pallet 21, and the pallet is evacuated to hold the wafer firmly in place. The vacuum line 173 is then deactivated, and the pallet with the wafer 39 firmly affixed thereto is then moved by actuating the motor 76 to rotate the lead screw 73 and move the pallet carrying apparatus 37 back to the position where the pallet 21 will be able to slide down on the posts 43a and 43b of the pallet support member 41b.

This process is repeated as many times as necessary to place wafers on the desired number of pallets and store those pallets on the support member 41b. Each time a pallet is stored at the uppermost level of the support member 41b, the elevator apparatus 51 for that support member is actuated to drop the entire stack of pallets sufficiently to allow the next pallet to be aligned with the posts 43a and 43b and placed on the top of the stack.

Figure 16:
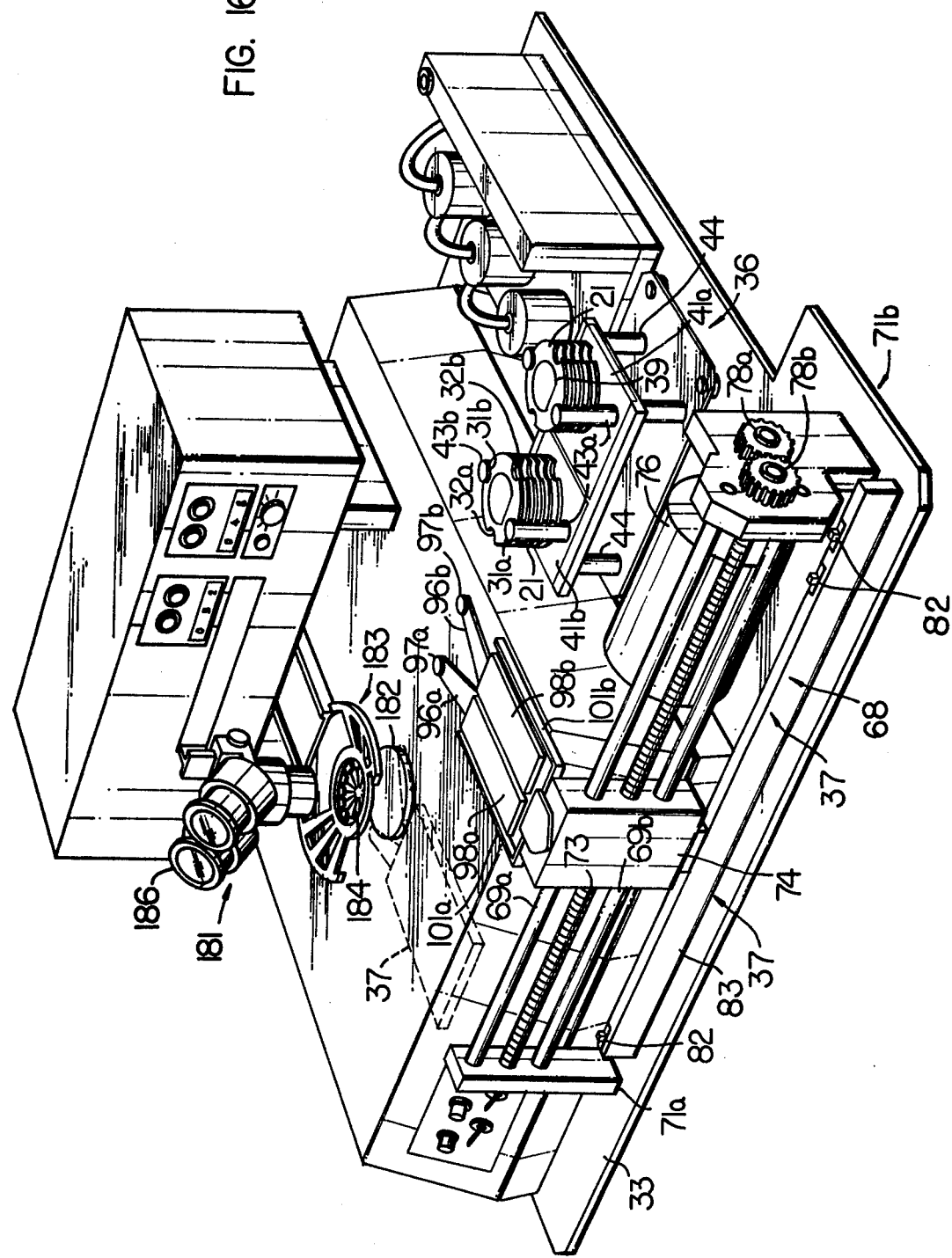
FIG. 16 is a perspective view of testing structure for a semiconductor wafer on a pallet
Figure 17:
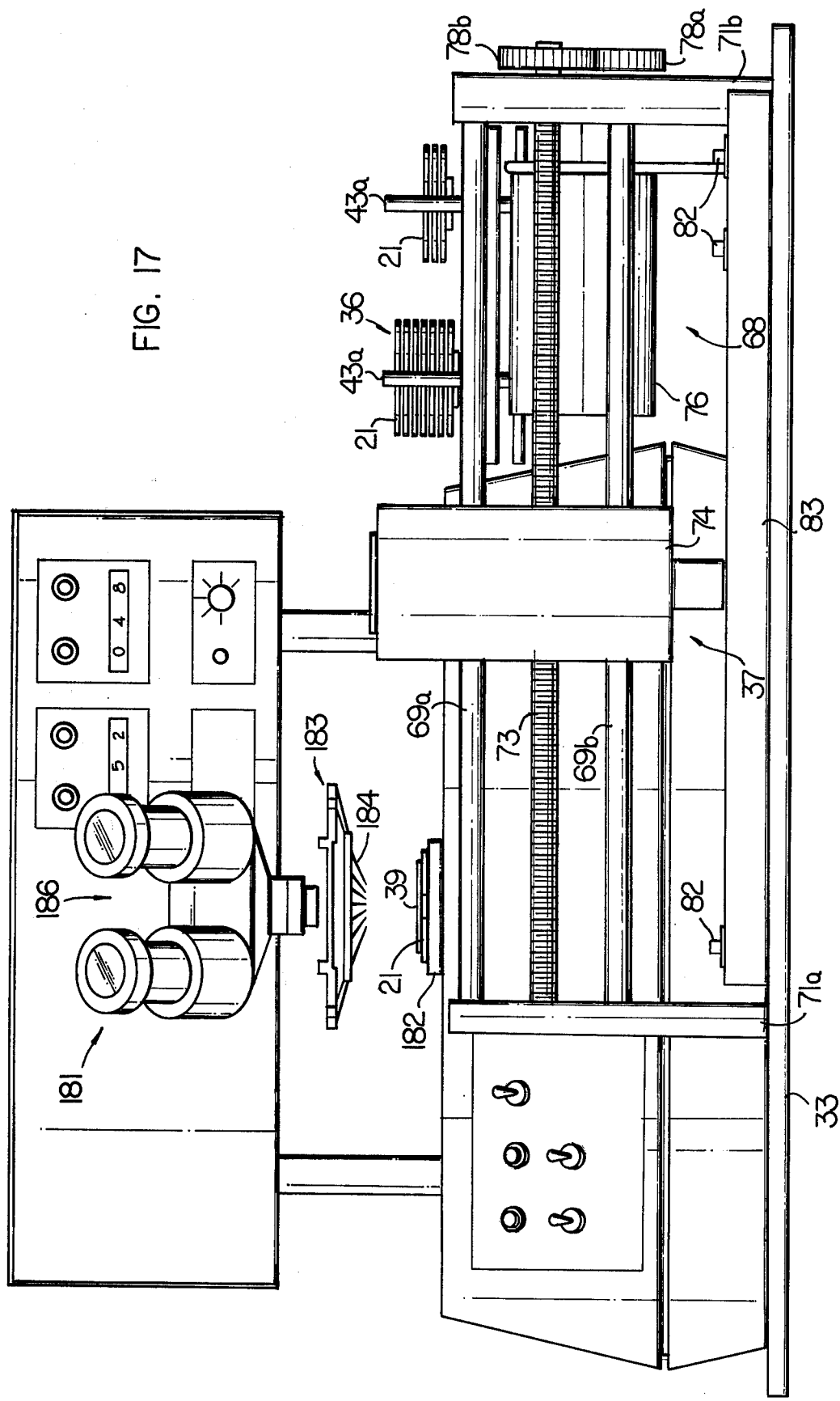
FIG. 17 is a front-elevational view of the apparatus in FIG. 16.
Figure 18:
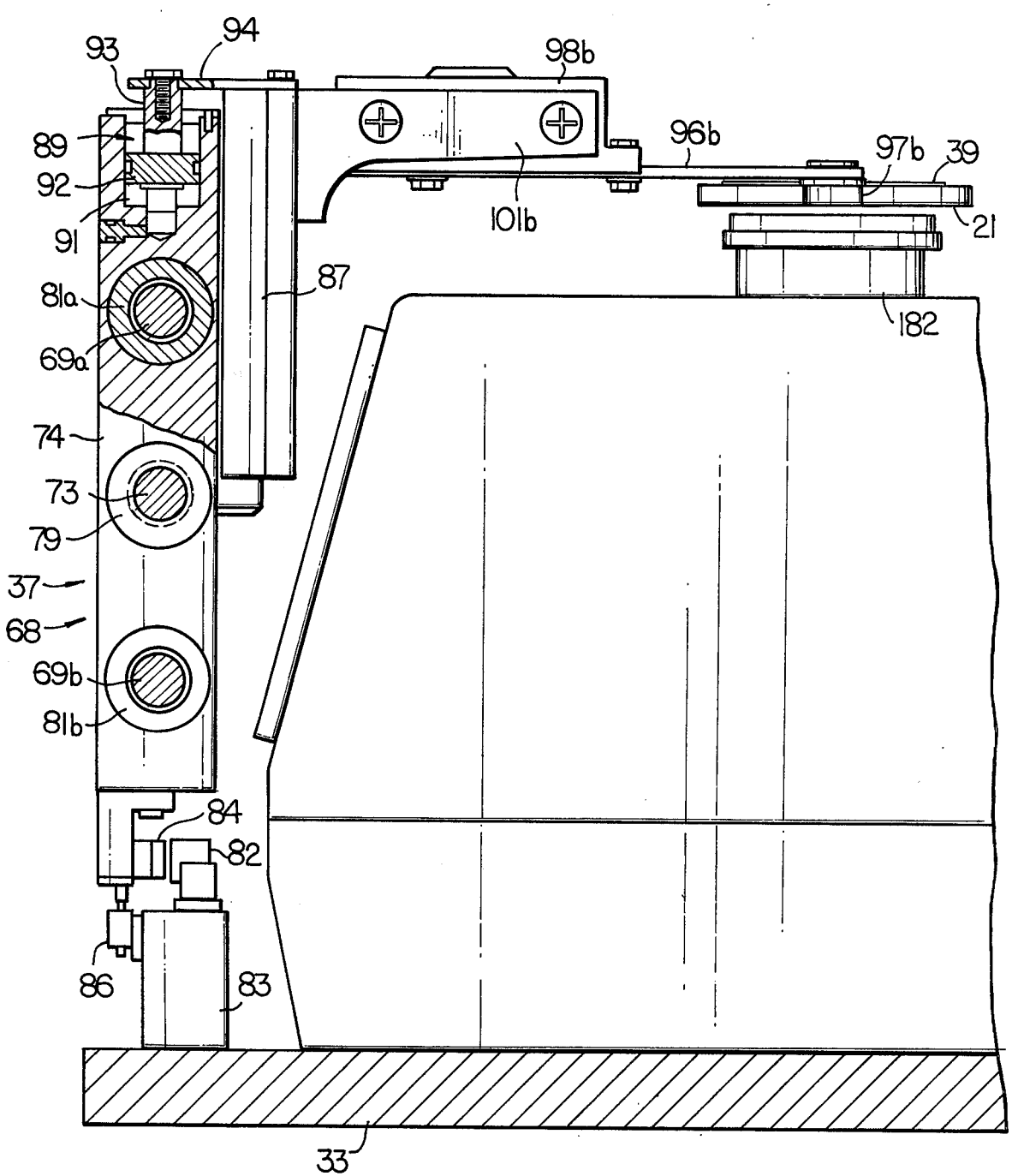
FIG. 18 is a side view of pallet carrying means in the apparatus of FIGS. 16 and 17.

The testing apparatus, which is generally identified by reference numeral 181 is shown in FIGS. 16-18 and includes manipulative apparatus so similar to the apparatus in FIGS. 3-15 that, wherever possible, the same reference numerals will be used to simplify description. The apparatus includes a base 33 with pallet storing apparatus 36 and pallet carrying apparatus 37.

Devices that are used only in the testing apparatus 181 include a pallet support 182, a measuring head 183 with a plurality of probes 184, and a microscope 186 that may be somewhat different from the microscope 38 in FIG. 3.

The pallet carrying apparatus 37 is driven by the lead screw 73 and is first caused to move to the pallet support member 41a on which untested pallets 21 are stacked. The top pallet to be tested is picked up from this stack by the pallet selecting apparatus 67 and is transported to the pallet support 182. As in the case of the alignment apparatus, magnetic sensors 82 are provided to indicate that the block 74 is in precisely the correct position, first to retrieve a pallet 21 from the support member 40a, then to deposit that pallet on the pallet support 182, and then to pick up the tested pallet and transport it to the stack of tested pallets on the pallet support member 41b. It will be noted that all three of the possible positions of a pallet are directly in line with each other so that the rollers 97a and 97b do not have to move in the direction toward or away from the guide rods 69a and 69b. This helps maintain a high degree of accuracy of placement of the pallets in the alignment and testing apparatus.

The pallet support 182 and the measuring head 183 may both be capable of vertical movement. In addition, the pallet support 182 includes means to connect it to a vacuum pump so that, when a pallet 21 is placed thereon, it may be held firmly in one position. This evacuation of the pallet support 182 takes place before the pallet selecting apparatus 67 releases the pallet. Thereafter, the pallet selecting apparatus waits beside the pallet support 182 until the testing is complete.

In the measuring, the contacts at the ends of the probes 184 press down against specific locations, which must correspond to contact pads on the individual chips 39a in a wafer 39. The testing is done electrically by supplying suitable voltages and currents to various combinations of the probes 184 to produce effects that are automatically evaluated by electronic means in the apparatus 181. Thus the entire testing operation can be accomplished without the assistance of an operator by simply causing the pallet transporting apparatus 37 to move back and forth and the testing operation to be carried out in the proper sequence.

The testing operation further requires that the probes 184 move from one chip area 39a to the next. This may be a very small distance of approximately 1 millimeter, and must be carried out in both the X and Y directions to cover the semiconductor wafer 39 completely. Such step-and-repeat operation can be carried out in a known manner, for example by connecting two pulse motors to the pallet support 182, and actuating those motors with suitable control voltages.

FIGS. 19A and 19B show means for controlling the pressure of the probes 184 on the surface of the wafer 39 so as not to damage that surface. At the same time, the apparatus shown in FIGS. 19A and 19B prevents the probe pressure from being too low and thereby causing an incorrect measurement.

One of the probes 184a in FIGS. 19A and 19B not only serves as a measuring probe, similar to the other probes 184 in FIGS. 16–18, but also serves as a sensing probe. The apparatus in FIGS. 19A and 19B includes a pressure sensor 187 that has a vertically movable head 188 thereon. There is a movable contact 189 under the head 188, and it is supported by a leaf 191. The movable contact is resiliently biased by a spring 192 compressed between the movable contact and the relatively rigid head 183. A contact 193 fixedly attached to a support 194 initially engages the movable contact 189.

In the operation of the structure in FIGS. 19A and 19B, the pressure sensor 187 is initially at some distance above the surface of the wafer 39, as shown in FIG. 19A. Then the pallet support 182 is elevated to bring the surface of the wafer 39 into contact with the probe 184a. This causes the movable contact 189 to be separated from the fixed contact 193, which furnishes an indication that the probe 184a has engaged the surface of the wafer 39. Elevation of the pallet support member 182 is preferably accomplished by means of a pulse motor, and after the contact 189 separates from the contact 193, the pulse motor (not shown) is energized by a specific pulses so that it continues to move the pallet support 182 a predetermined additional distance. This is shown in FIG. 19B. The actual additional distance moved by the pallet support 182 after connection is broken between the contacts 189 and 193 is kept small enough so that neither the probes 184 in FIG. 16 nor the wafer 39 can be damaged. It should be noted that the same relative movement can be effected between the pallet support 182 and the sensor 187 by controlling the vertical movement of either or both of them by separate pulse motors.

While this invention has been described in terms of a specific embodiment, it will be recognized by those skilled in the art that modifications may be made therein within the scope of the invention as defined by the following claims.

What is claimed is:

1. Apparatus comprising:
   a plurality of individual disc-shaped pallets each having chuck means operative for securing to a face of the respective pallet a wafer-shaped article of smaller diameter than the pallet;
   storage means for supporting said pallets in first and second stacks;
   first holding means for holding one of said disc-shaped pallets at opposed portions of the edge thereof;
   driving means for moving said first holding means vertically and horizontally so as to pick-up the uppermost of said pallets from said first stack and transport the same to an article-receiving station, whereupon, the pallet with a wafer-shaped article thereon is transported to the top of said second stack;
   second holding means at said article-receiving station for holding a wafer-shaped article by a face thereof; and
   transport means for moving said second holding means in respect to said first holding means at said article-receiving station so as to adjust the position of the wafer-shaped article held by said second holding means in respect to a pallet held by said first holding means prior to the operation of said chuck means of said pallet for securing the article thereto.

2. Apparatus comprising:
   a plurality of individual disc-shaped pallets each having a wafer-shaped article secured at a precisely predetermined position on a face of the pallet;
   storage means for supporting said pallets in first and second stacks;
   holding means for holding one of said disc-shaped pallets at opposed portions of the edge thereof, said holding means including a pair of arms movable relative to each other with one of said arms determining a precise position of the held pallet relative to said holding means and the other of said arms moving to effect the gripping and releasing of a pallet;
   pallet support means at a testing station spaced from said stacks;
   driving means for moving said holding means so as to pick-up the uppermost of said pallets from said first stack and transport the same to a precisely predetermined position on said pallet support means and, thereafter, to pick up the pallet from said support means and transport the same to the top of said second stack; and
   a measuring device at said testing station for measuring the wafer-shaped article on a pallet at said precisely predetermined position on said support means.

3. An aligning apparatus comprising a microscope, a pallet having a flat major surface for supporting a semiconductor wafer thereon and opposed indexing edge portions at the margin of said surface, positioning means engageable with said opposed indexing edge portions of the pallet for positioning the latter at a predetermined location in respect to said microscope with said major surface of the positioned pallet being within the field of view of said microscope, holding means including a vacuum chuck, means for moving said holding means in directions normal to the plane of said major surface of the positioned pallet so as to move said vacuum chuck into and out of contact with a face of the wafer supported on said major surface, means for selectively operating said vacuum chuck for adhering the latter to said face of the wafer when in contact therewith, first drive means selectively operable for moving said holding means in orthogonally related directions lying in a plane parallel to said plane of the major surface of said positioned pallet, and second drive means selectively operable for rotating said holding means about an axis normal to said plane of the major surface so that, with said chuck adhered to the wafer, said wafer can be selectively moved with said holding means in said orthogonally related directions and about said axis for alignment of said wafer in respect to the indexing edge portions of said positioned pallet in said field of view of the microscope by selective operations of said first and second drive means.

4. A method of testing semiconductor wafers comrpising the steps of providing a plurality of pallets each having a flat major surface, opposed indexing edge portions at the margin of said surface and spaced apart spacers extending from the opposite surface of the pallet, disposing a semiconductor wafer on said major surface of each of the pallets with the wafer being smaller than said major surface so as to fit within an area delineated by said spacers, aligning said wafer on each pallet in respect to said indexing edge portions of the latter, securing the aligned wafer on the respective pallet, stacking the pallets one upon the other at a first predetermined location with the wafers secured on the stacked pallets, transferring the pallets one at a time from said first predetermined location to a testing station at which a measuring device is provided with probes, positioning said indexing edge portions of the pallet at said testing station in respect to said probes, contacting the probes with the wafer secured on the pallet thus positioned at the testing station for electrical testing of the wafer by the measuring device, and transferring each pallet, after the testing of the wafer thereon, from said testing station to a second predetermined location and there stacking the pallets in succession one upon the other.

5. The apparatus according to claim 1 in which each disc-shaped pallet comprises:

a plurality of air inlets opening at said face thereof; and means for connecting said inlets to evacuation means; and in which interengaging means are provided in said storage means, each said pallet and said first holding means to control the orientation of said first holding means and each said disc-shaped pallet.

6. The apparatus according to claim 5 in which each said disc-shaped pallet has at least three spacer means extending from said face thereof a distance at least equal to the thickness of said wafer-shaped article, said spacer means being spaced apart far enough to allow said wafer-shaped article to fit between them, whereby to protect the wafer-shaped articles from damage in said second stack.

7. The apparatus according to claim 1 in which said second holding means comprises:

A. suction means;
B. rotational means to rotate said wafer-shaped article about the vertical axis; and
C. translational means to move said wafer-shaped article in a horizontal plane.

8. The apparatus of claim 2 comprising means to move said holding means vertically.

9. The apparatus according to claim 2 in which said measuring device including probes to engage specific minute locations on said wafer-shaped article to measure said wafer-shaped article electrically.

10. The apparatus according to claim 9 further comprising:

means for changing the distance between said measuring device and said wafer-shaped article on a pallet on said support means in a direction perpendicular to the surface of the article;

means for detecting that at least one of said probes touches said wafer-shaped article; and means for moving said measuring device and predetermined additional distance beyond the point of contact between said one probe and said wafer-shaped article.

* * * * *